(12) United States Patent
Bartlett

(10) Patent No.: US 7,683,672 B2
(45) Date of Patent: Mar. 23, 2010

(54) DYNAMICALLY CONTROLLED OUTPUT SLEW RATE PAD DRIVER

(76) Inventor: Donald Bartlett, 4625 Eagle Lake South, Fort Collins, CO (US) 80524

( * ) Notice: Subject to any disclaimer, the term of this patent is extended or adjusted under 35 U.S.C. 154(b) by 0 days.

(21) Appl. No.: 12/208,040

(22) Filed: Sep. 10, 2008

(65) Prior Publication Data
US 2009/0066422 A1    Mar. 12, 2009

Related U.S. Application Data

(60) Provisional application No. 60/971,222, filed on Sep. 10, 2007.

(51) Int. Cl.
*H03K 19/094*   (2006.01)
*H03K 5/12*   (2006.01)

(52) U.S. Cl. .................... 326/83; 327/170; 330/296
(58) Field of Classification Search .................. 326/83, 326/26, 27, 28; 330/296, 85; 327/170
See application file for complete search history.

(56) References Cited

U.S. PATENT DOCUMENTS
2003/0122617 A1*   7/2003   Johnston ............... 330/85

* cited by examiner

*Primary Examiner*—Daniel D Chang
(74) *Attorney, Agent, or Firm*—William W. Cochran; Cochran Freund & Young LLC

(57) ABSTRACT

Disclosed is a dynamically controlled, output slew rate pad driver that generates a controlled voltage on an interface node of an interface circuit, such as an input circuit, an output circuit, or a combined input/output circuit, to control the process of slewing the controlled voltage on the interface node. The slewing occurs substantially independently of capacitive loads connected to the interface node. Prior to initiation of the slewing process, an initial charge is generated on a storage capacitor. The storage capacitor is then connected to the gate of a driver transistor to charge the input parasitic gate capacitance of the driver transistor to approximately a gate threshold voltage of the driver transistor. A constant current source is also provided that is applied to the input of an integrating amplifier and an integrating capacitor that is connected to the interface node. The constant current is integrated to provide a controlled, slewed voltage on the interface node by charging the integrating capacitor with a constant current from the constant current source.

7 Claims, 6 Drawing Sheets

Detailed Block Diagram of N-Channel Portion of Controlled Output Slew Rate Pad Driver

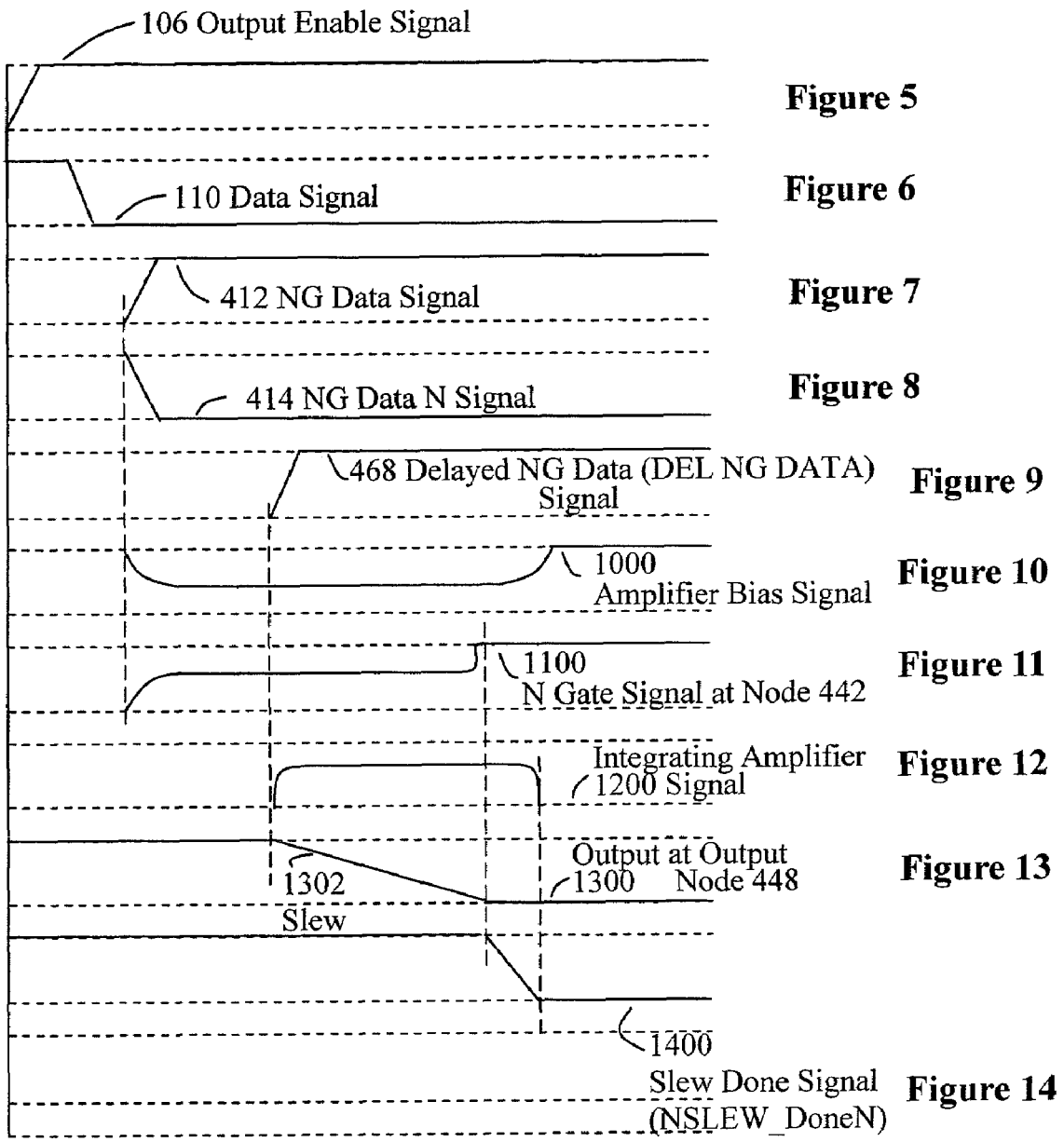

US 7,683,672 B2

DYNAMICALLY CONTROLLED OUTPUT SLEW RATE PAD DRIVER

CROSS REFERENCE TO RELATED APPLICATION

This application is based upon and claims the benefit of U.S. provisional application No. 60/971,222, entitled "DYNAMICALLY CONTROLLED OUTPUT SLEW RATE PAD DRIVER," filed Sep. 10, 2007, the entire disclosure of which is herein specifically incorporated by reference for all that it discloses and teaches.

BACKGROUND OF THE INVENTION

Output drivers built in standard CMOS technologies vary greatly in their performance characteristics as a result of process variations, temperature variations, operating voltage variations, and output capacitive loading. These variations cause the delay time and the slew rate at the output of the pads to vary considerably. The emphasis of most designers has been in managing the slew rate of the output of input/output drivers. Techniques that have been used by designers include segmentation of the output driver and monitoring of variables that affect the output slew rate, including process, voltage, temperature and load capacitance. The output pad is then calibrated, based on the characteristics of these variables, and adjustments are made. Calibration circuitry is required and the calibration process takes additional time. Additional power, circuitry requiring silicon area, and a larger number of critically time control signals are required using this technique. This leads to greater engineering effort and product cost.

Segmentation has also been used in a process in which the device segments are driven at slightly different times from each other, such that the driving point impedance at the output node is adjusted as the voltage of the output changes. This method also requires a calibration loop for compensation of process, voltage, temperature and load capacitance variables. Again, this technique is expensive to implement.

SUMMARY OF THE INVENTION

An embodiment of the present invention may therefore comprise a method of generating a controlled voltage on an interface node of an interface circuit to control a process of slewing the controlled voltage on the interface node substantially independently of capacitive loads connected to the interface node comprising: generating an initial charge on a storage capacitor; connecting the storage capacitor to a gate of a driver transistor to charge an input parasitic gate capacitance of the driver transistor to approximately a gate threshold voltage of the driver transistor prior to initiating the process of slewing the voltage on the interface node of the interface circuit; generating a constant current from a constant current source; applying the constant current to an input of an integrating amplifier and an integrating capacitor that is connected to the interface node; integrating the constant current during the process of slewing the voltage on the interface node by charging the integrating capacitor with the constant current from the constant current source.

The present invention may further comprise a slew control circuit that controls the slew on an interface node comprising: a driver transistor having a gate and an output that is connected to the interface node to drive the interface node; a voltage source that provides a supply voltage; a storage capacitor that is connected to the supply voltage and charges to approximately a gate threshold voltage of the gate of the driver transistor; a control circuit that disconnects the storage capacitor from the supply voltage and connects the storage capacitor to the gate of the driver transistor to charge the gate of the driver transistor to approximately the gate threshold voltage; a constant current source that generates a substantially constant current; an integrating amplifier having an input that is connected to the constant current source and an output that is connected to the gate of the driver transistor; an integrating capacitor that is connected to the interface node and the constant current source that integrates the constant current and controls the slew on the interface node.

The present invention may further comprise a method of amplifying a signal and eliminating static currents comprising: providing a constant voltage from a voltage reference; providing an amplifier; biasing an input of the amplifier with the constant voltage.

The present invention may further comprise a common gate amplifier that eliminates static currents comprising: a first diode connected transistor that has a source that is connected to a power supply and a gate that provides a substantially constant voltage; a second diode connected transistor having a gate that is connected to the gate of the first diode connected transistor and a source that is connected to the power supply.

BRIEF DESCRIPTION OF THE DRAWINGS

FIG. 5 is a graph of the output enable signal.

FIG. 6 is a graph of a data signal.

FIG. 7 is a graph of the NGDATA signal.

FIG. 8 is a graph of the NGDATAN signal.

FIG. 9 is a graph of the delayed NGDATA (DELNGDATA) signal.

FIG. 10 is a graph of the amplifier bias signal.

FIG. 11 is a graph of the NGATE signal.

FIG. 12 is a graph of the integrating amplifier signal.

FIG. 13 is a graph of the output signal at the pad.

FIG. 14 is a graph of the slew done signal.

DETAILED DESCRIPTION OF EMBODIMENTS OF THE INVENTION

Figure 1:
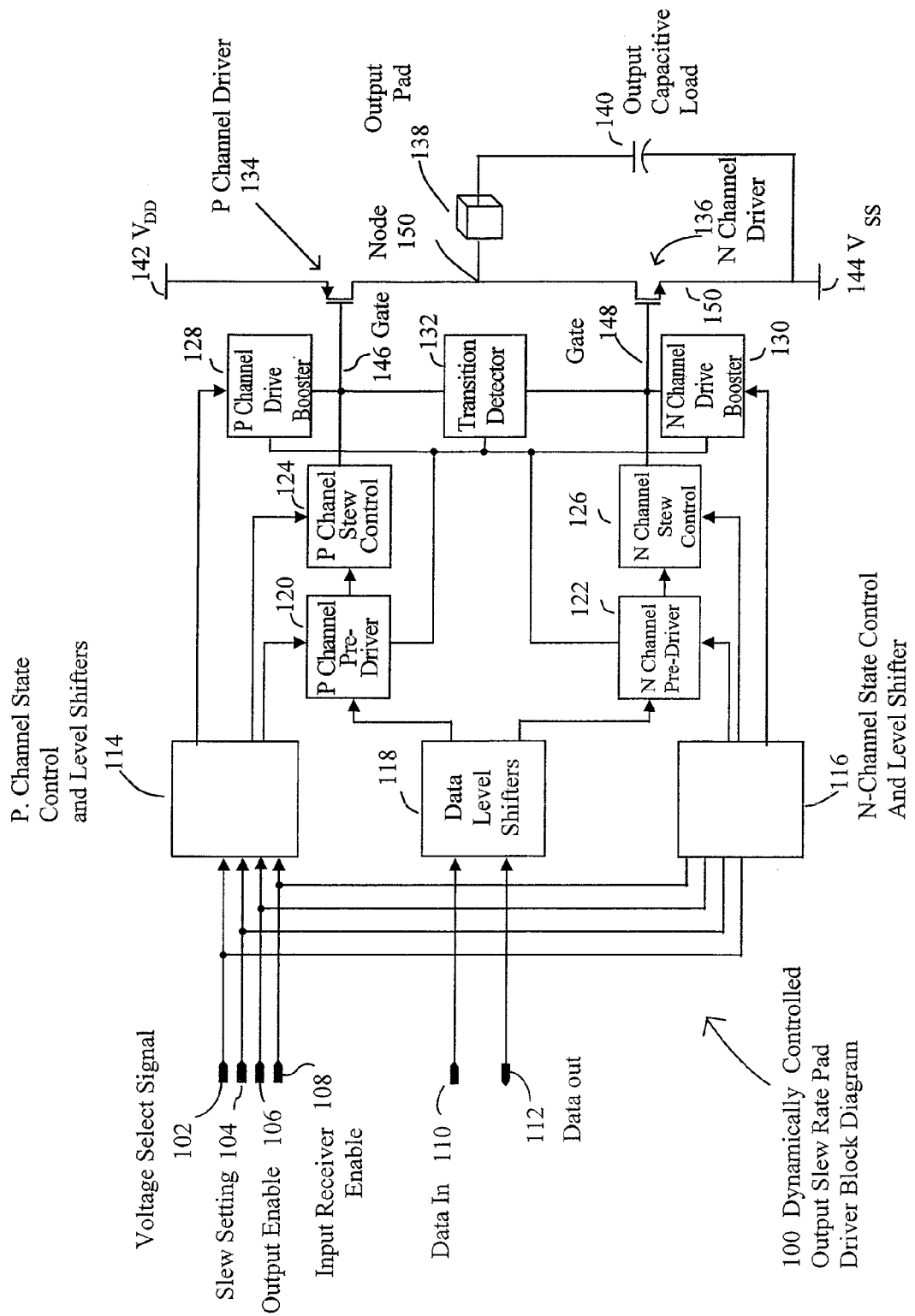
FIG. 1 is a block diagram that illustrates an embodiment of the dynamically controlled output slew rate pad driver.

FIG. 1 is a schematic block diagram that illustrates one embodiment of a dynamically controlled output slew rate pad driver. As shown in FIG. 1, various signals are applied to the pad driver, including a voltage select signal 102 that allows the user to select the operating voltages, a slew setting control signal 104, that allows the user to select the slew rate, an output enable signal 106 that enables the output, an input receiver enable signal 108 that enables the input receiver, a data in signal 110 and a data out signal 112. The voltage select signal 102, the slew setting control signal 104, the output enable signal 106 and the input receiver enable signal 108 are applied to both the P-channel state control and level shifter 114 and the N-channel state control and level shifter 116.

Although FIG. 1 shows an output pad driver 100, the device of FIG. 1 can be implemented in both stand alone, input, or output pad cells, as well as combination input/output pad cells. The same principles that are discussed with respect to the output pad driver illustrated in FIG. 1, also apply to input/output pad drivers and input pad drivers. The output pad driver illustrated in FIG. 1 is built with complementary drive capabilities. In that regard, FIG. 1 illustrates a P-channel driver 134 that is used to pull the output voltage high, while the N-channel driver 136 pulls the output voltage low. Complimentary circuitry is shown in FIG. 1 for controlling both the P-channel driver 134 and the N-channel driver 136. Since these devices operate in a similar manner, the description of various portions of this invention will be directed only to the N-channel circuitry which describes the pull down function, which is sufficient to describe the complementary pull up function.

As shown in FIG. 1, the P-channel state control and level shifters 114, and the N-channel state control and level shifters 116, allow the user to control features and performance of the output pad driver 100. The ability to select different settings for the nominal output slew rate is beneficial in controlling the amount of noise created in the output driver power supply and ground return. This is accomplished by using the slew setting signal 104. For example, various chips may operate at different speeds. A slower slew rate cannot be used, for example, with a chip operating at 1 GHz. The embodiment of FIG. 1 allows the user to select a higher slew rate, in this instance, to be compatible with the 1 GHz chip to which it is connected. Alternatively, a slower slew rate may be selected by the user using slew setting signal 104 when a slower slew rate is desired. For example, a slower slew rate may be desirable so that high frequency noise is not generated by the pad driver 100 if higher speed operation is not required. Simple binary signals from the digital control circuitry or potentially a microprocessor (not shown) that is connected to the pad driver 100 are generated as the slew setting signal 104.

When the output pad driver 100 is used in an input/output configuration, the output driver can be enabled using output enable signal 106, and the input receiver can be enabled using the input receiver enable signal 108. This allows the pad driver, illustrated in FIG. 1, to be utilized in several different ways by the user. Since the voltage select signal 102, slew setting signal 104, output enable signal 106 and input receiver enable signal 108 are generated by digital control circuitry or potentially a microprocessor that controls the pad driver 100, these signals are generated at the core voltage of the integrated circuit. Level shifters are included in the P-channel state control and level shifters 114 and N-channel state control and level shifters 116 to translate these core level voltage signals into voltage levels that are compatible with the voltages of the pad driver 100. For example, the core voltage of a microprocessor may be 1 volt, whereas the operating voltages of the pad driver 100 may be 1.8 volts or 3.3 volts. The voltage select signal 102 will allow the user to select the desired operating voltage of the pad driver 100.

As also shown in FIG. 1, the data-in signal 110 is applied to the data level shifters 118, which control the data signal path. It is critical that the data path from the input of the data level shifters 118 to the output drive signal is not distorted with respect to phase characteristics of the data signal, and that the delay from the input to the output of the data path is managed, such that high frequency signals are transmitted. Phase distortion characteristics can be measured as duty cycle errors, pulse width errors and sometimes as deterministic jitter. Random error sources impacting the phase characteristics are generally characterized as a random jitter. Due to these strict requirements with respect to phase distortion along the data path, the data path level shifter has a more detailed circuit design. The output driver incorporates a level shifter, as explained below, that ensures operation without static power, has low phase distortion and operates over a wide range of input, core side, power supply voltages, and output, driver-side power supply voltages.

The P-channel pre-driver 120 and the N-channel pre-driver 122 provide buffering of the input data (signal conditioning) after the input data signal has been level translated. The pre-drivers 120, 122 also control the generation of timed edges in order to ensure that there is no totem pole current (shoot through current) from $V_{DD}$ 142 to $V_{SS}$ 144 through the P-channel driver 134 and N-channel driver 136. For example, if the input data signal is high and, thus, the output at the output pad 138 is high, and the input data transitions to low, the output voltage at the output pad 138 will transition to low ($V_{DD}$ 144). This transition from high to low at the output requires that the N-channel driver 136 be turned on (switched on) so that the voltage at node 150, and hence the voltage at the output pad 138, be connected to the low voltage $V_{SS}$ 144. This is accomplished by applying a signal to the gate 148 of N-channel driver 136. The same signal is generally used, in many prior art devices, to apply a signal to the gate 146 of P-channel driver 134 to turn off the P-channel driver 134, which isolates node 150 from the high voltage $V_{DD}$ 142. If this is the case, there will be some current that flows from $V_{DD}$ 142 to $V_{SS}$ 144, since both devices will simultaneously be turned on for a certain amount of time. This creates excessive power dissipation and noise that is generated in the power supply and on the ground nodes. This type of feed-through current can be prevented by turning off the P-channel output driver slightly before the N-channel driver is turned on.

The P-channel drive booster 128 and the N-channel drive booster 130 initiate the turn-on phase of the P-channel driver 134 and N-channel driver 136, respectively. For example, if the output is to be pulled down, the N-channel output driver 136 is turned on, and the P-channel driver 134 is turned off. If the output is to be pulled up, the P-channel driver 134 is turned on, and the N-channel driver 136 is turned off. As indicated above, this process is initiated by activating the P-channel drive booster 128 and the N-channel drive booster 130. These devices provide quick charging of the P-channel driver 134 and the N-channel driver 136 to the appropriate gate voltage. For example, the gate 148 of the N-channel driver 136 is initially charged to the gate voltage that can exist between the gate 148 and source 150 of the N-channel driver 136. Quick charging of the gate to source voltage of the N-channel driver 136 decreases the turn-on time of the N-channel driver 136 when the data signal is applied to gate 148. Hence, quick charging of the gate to source voltage ($V_{GS}$) of N-channel driver 136 decreases the overall delay in the operation of the N-channel driver 136. The complimentary function is performed by the P-channel driver booster 128 for P-channel driver 134.

After quickly charging the gate to source voltage ($V_{GS}$) of the N-channel driver 136, the pull down slewing process can be initiated. The slewing process for controlling the N-channel driver 136 is performed substantially independently of the output load capacitance 140 by placing the N-channel driver 136 in a feedback loop with an integrating amplifier that carefully controls the input drive current to the N-channel driver, and a feedback integrating capacitor that integrates a constant current from a constant current source, in a linear fashion over a period of time, to create the desired slewed output. The P-channel slew control 124 and the N-channel slew control 126 contain the constant current source that generates the constant current that is applied to the integrating capacitor. The constant current generated by the constant current sources in P-channel slew control 124 and N-channel slew control 126 can be changed to various different constant currents by applying alternative settings for slew setting control signal 104. Additionally, other current sources with different current characteristics with respect to time can be used to drive the integrator block in order to generate different output slew characteristics. For example, if a current ramp is used as the input current, an exponential slew rate can be generated since the input current is integrated by the circuit and the integral of a ramp current is an exponential voltage. P-channel slew control 124, and N-channel slew control 126, also include an input amplifier stage and an integrating capacitor, which are more fully disclosed below. The integrating amplifier that is placed in the feedback loop uses a common gate stage in conjunction with the output drivers 134, 136. Transition detector 132 generates an output signal to fully turn on the P-channel driver 134 and the N-channel driver 136 after the slewing process is complete. Once the slewing output signal 138 reaches a final value, the gate 146 of P-channel driver 134 and the gate 148 of the N-channel driver 136 are clamped to $V_{SS}$ 144 and $V_{DD}$ 142, respectively. Transition detector 132 is coupled to internal nodes of the output pad driver 100, illustrated in FIG. 1, rather than detecting a predetermined threshold voltage of the output drivers 134, 136 or the output node 138 to determine when the slewing process is complete. This provides a much more accurate method of detecting the completion of this slewing process and provides an output signal that is more accurate than prior art devices.

As also shown in FIG. 1, after the slewing process is complete and the voltage at the node 150 has been slewed to the low voltage $V_{SS}$ 142, the gate 148 of N-channel driver 136 is fully turned-on by clamping gate 148 to the low voltage $V_{SS}$ 142. The P-channel slew control 124 operates in a complimentary fashion. The transition sensor 132 monitors internal circuit nodes to determine when the slewing portion of the process is complete.

Figure 2:
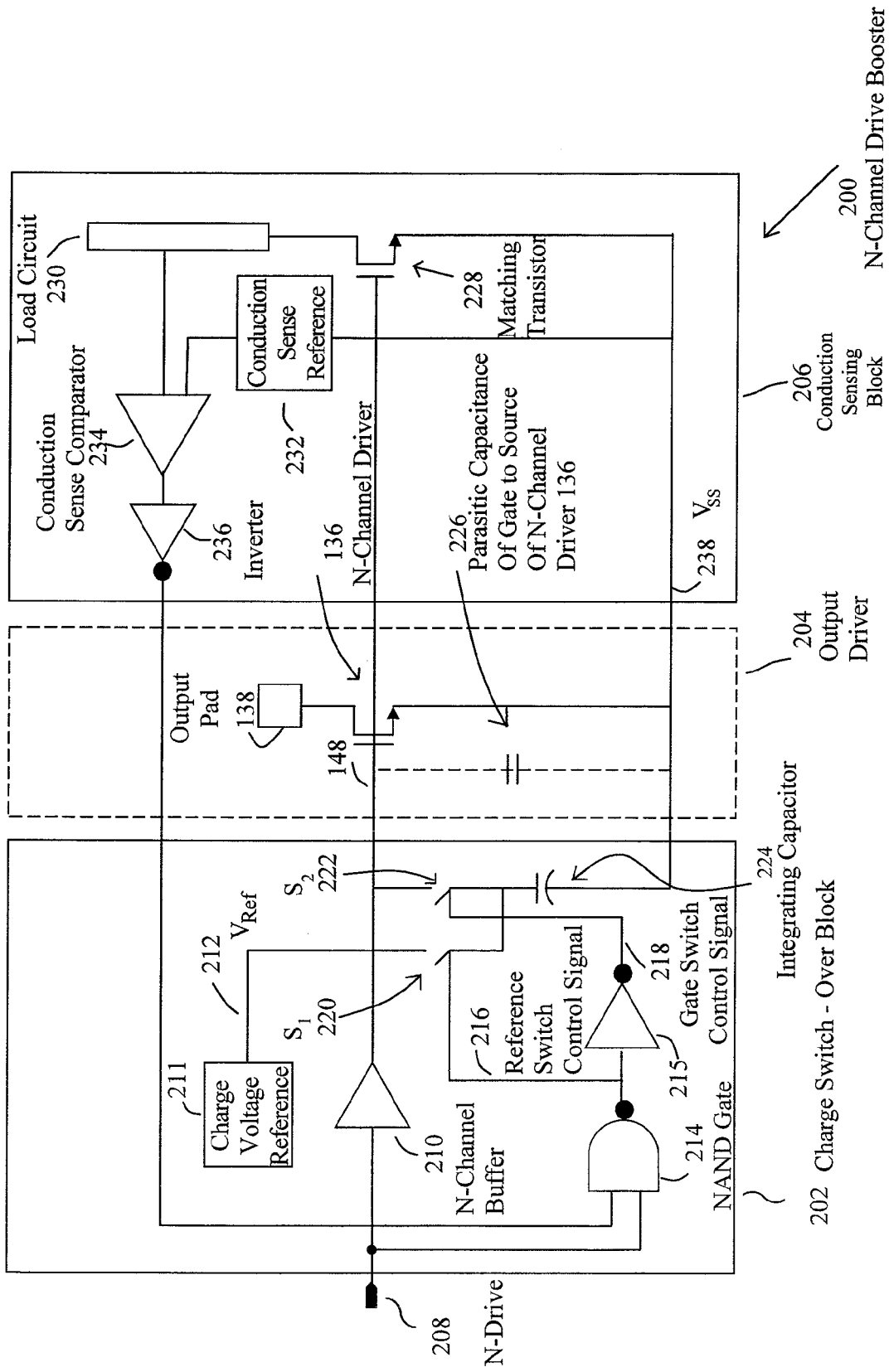
FIG. 2 is a schematic illustration of a portion of an embodiment of an N-channel drive booster.

FIG. 2 is a schematic diagram of an N-channel driver booster 200. As shown in FIG. 2, the N-channel drive booster 200 comprises a charge switch-over block 202 and a conduction sensing block 206, which are both connected to the output driver 204. The primary function of the N-channel drive booster 200 is to quickly charge the gate 148 of the output driver 136 upon initiation of the slewing of the output signal. The N-channel driver 136 is a large device that is capable of discharging the output load capacitance 140 of the output load in a manner that is consistent with the timing of the input signal. For example, if the shortest period of the input is one nanosecond, then the output device needs to be sized such that the largest load capacitance can be discharged completely in approximately 300 picoseconds. In prior art devices, the gate of the output driver is driven directly with an inverter. The current used to charge the gate of the driver is supplied through a P-channel device of an inverter that is connected to a power supply. The manner in which the gate of the driver can be charged faster, to prevent delay in the output driver, is to make the inverter larger. However, the larger that the inverter is made, the more current it draws from the power supply. As current is drawn more quickly from the power supply, the change of current over time (di/dt) increases, which contributes to noise on the power supply due to series impedances in the power supply connection that is reflected throughout this circuit and other circuits connected to the same power supply. Hence, a rapid charging of the gate of the driver, and thus a rapid change in the output voltage and charging/discharging current, in prior art devices, increases noise in the circuit from the power supply. Also, if the power supply is unable to provide high di/dt, power gaps can be generated.

The embodiment illustrated in FIG. 2 utilizes a charge sharing approach between an storage capacitor 224 and the parasitic capacitance 226 that exists between the gate and source of the N-channel driver 136. In operation, the storage capacitor 224 is charged to a reference voltage 212 generated by charge voltage reference device 211 when switch (S1) 220 is closed. When switch (S2) 222 is closed, the voltage $V_{REF}$ that is stored on storage capacitor 224 is redistributed between storage capacitor 224 and the parasitic capacitance 226 in an instantaneous fashion. The gate to source voltage on gate 148 is equal to $V_{REF}*C_I/(C_I+C_P)$ where $C_I$ is the capacitance of storage capacitor 224 and $C_P$ is the parasitic capacitance 226. By carefully selecting the reference voltage $V_{REF}$ 212, and the value of C1, the voltage at gate 148 can be predicted. The optimal voltage is somewhat dependent on the application. However, it is clear that the voltage at gate 148 can be scaled to the value that best fits the application. For example, $V_{REF}$ can be generated such that it has a value of $2*V_{TH}$, where $V_{TH}$ is the threshold voltage of the gate of N-channel driver 136. The capacitance of storage capacitor 224 ($C_I$) can be scaled to equal the parasitic capacitance 226 ($C_P$). In this example, the final voltage at gate 148 will be $V_{Gate-to-Source}=V_{REF}*V_I/(C_I+C_P)=V_{Threshold}$ after switch (S2) 222 is closed. The initiation of the process of the charge switch-over block 202 begins with the N-drive signal 208 transitioning from a low to high state. Prior to the time that N-drive 208 transitions from low to high, switch (S1) 220 is closed and switch (S2) 222 is open. In this condition, storage capacitor 224 charges to $V_{REF}$ 212. When N-drive 208 transitions from low to high, NAND gate 214 generates a reference switch control signal 216 that opens switch 220. Inverter 215 generates a gate switch control signal 218 that closes switch (S2) 222. The charge on storage capacitor 224 is instantaneously distributed between the parasitic capacitance 226 and the storage capacitor 224. By setting the voltage $V_{REF}$ 212 to two times the threshold voltage of the N-channel driver 136, the N-channel driver 136 can be instantaneously set to a condition to start conducting without delay. The speed at which the parasitic capacitance 226 is charged by the storage capacitor 224 is limited only by the impedance of the switch (S2) 222, since the nature of capacitors is to quickly charge. The charging of the parasitic capacitance 226 is not only instantaneous, but does not require current to be drawn from a large inverter, which is in turn is connected to the power supply. Hence, a large supply of instantaneous current from an inverter and a power supply is not required to charge the parasitic capacitance 226, and minimal noise is created in the circuit that is illustrated in a charge switch-over block 202.

FIG. 2 also illustrates a conduction sensing block 206. The conduction sensing block 206 is used to determine when the N-channel driver 136 is conducting. This is accomplished by utilizing a matching transistor 228 that matches the characteristics of the N-channel driver 136. Matching transistor 228 has a load circuit 230. When the matching transistor 228 is turned on, which occurs simultaneously when the N-channel driver 136 is turned on (since they are matching transistors with the same gate and source connections), a voltage drop occurs across load circuit 230. The voltage drop across load circuit 230 is detected by a conduction sense comparator 234, which compares the voltage at the load circuit 230 and a reference voltage generated by a conduction sense reference device 232. The conduction sense comparator 234 generates a signal which is inverted by inverter 236 and is applied to the NAND gate 214 to indicate when the matching transistor 228 and, hence the N-channel driver 136 start conducting. In this manner, switch (S1) 220 is closed during the full period of the input signal, which allows the storage capacitor 224 to charge gradually over the full period of the input signal. Storage capacitor 224 can be placed physically close to the N-channel driver 136 on the chip, so that the charge redistribution current flows on the $V_{SS}$ bus 238. In other words, the current only locally flows locally between the storage capacitor 224 and the parasitic capacitance 226 on the gate 148 and $V_{SS}$ bus 238, and generates minimal noise in the circuit, even though the parasitic capacitance 226 is very rapidly charged to the threshold voltage of the N-channel driver 136. The N-channel buffer 210 functions to drive gate 148 of the N-channel driver 136 after the initial charging of the parasitic capacitance 226 is completed. The N-channel buffer 210 constitutes the amplifier 312 (FIG. 3) that is used to drive the gate of the N-channel driver 136.

Figure 3:
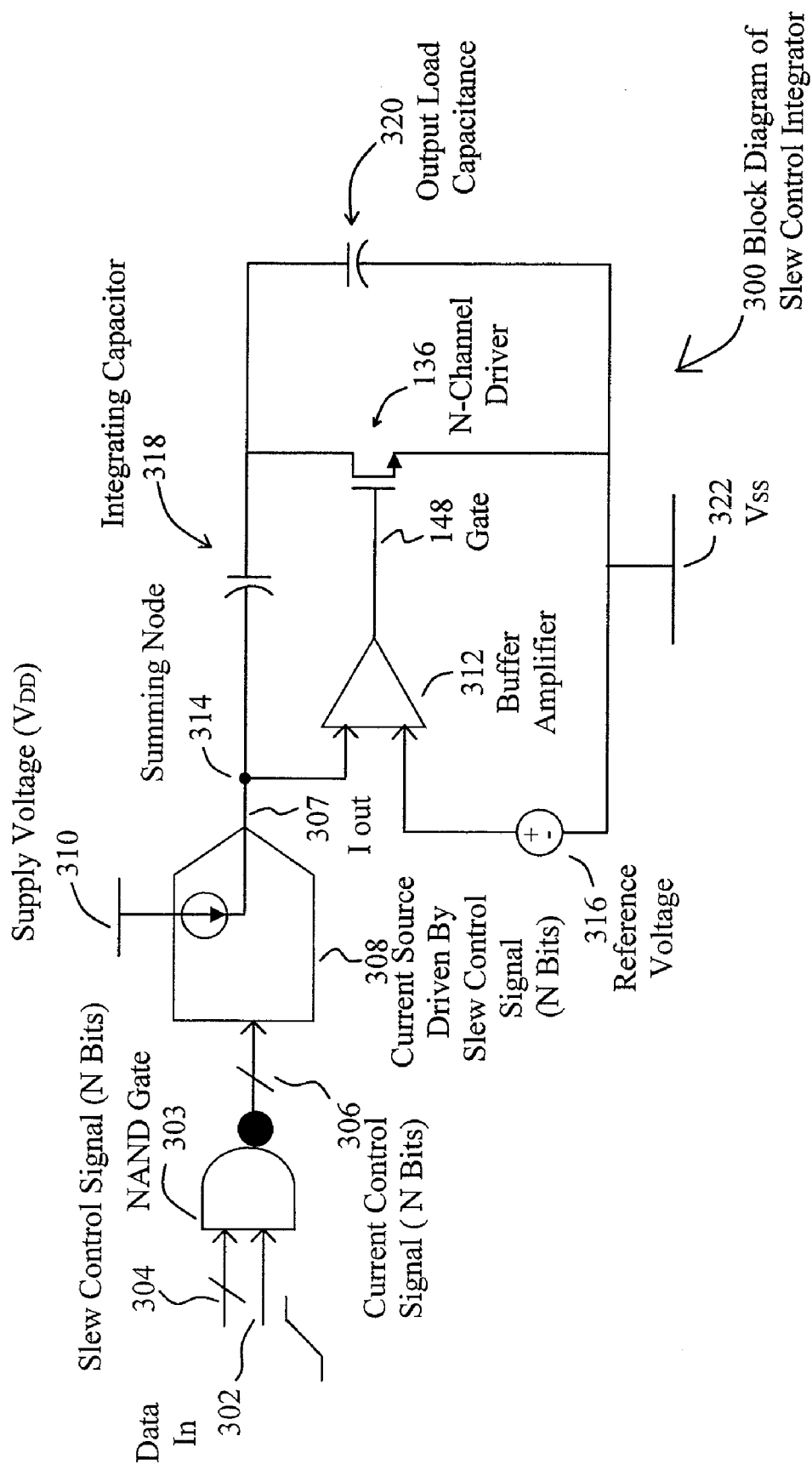
FIG. 3 is a schematic block diagram of an embodiment of a slew control integrator.

FIG. 3 is a schematic illustration of an embodiment of a slew control integrator 300. Again, FIG. 3 illustrates the N-channel only. The P-channel operates in a complimentary fashion. As shown in FIG. 3, a slew control signal 304, having N bits, is applied to a NAND gate 303. In addition, the data-in signal 302 is also applied to the NAND gate 303. The NAND gate 303 generates a current control signal that is N bits long which is applied to current source 308. Current source 308 generates an output current $I_{OUT}$ at the output 307 of the current source 308 that has a magnitude that is selected by the slew control signal 304. The slew control bits set the current $I_{OUT}$ so that the desired slew rate can be achieved. In other words, by adjusting the value of the digital code of the slew control signal 304, the output slew rate of the N-channel driver 136 can be easily adjusted. Buffer amplifier 312 drives the gate 148 of the N-channel driver 136 and supplies the required charging current to integrating capacitor 318 without taking current away from the gate 148. The buffer amplifier 318 compares the summing node voltage 314 and the reference voltage 316 to drive the gate current 148. Due to the gain of the buffer amplifier 312, the loop acts to force the summing node to equal the reference node of the amplifier. The behavior is not unlike any typical high-gain amplifier block configured as an integrator. Since the summing node is nearly the same value as the reference node, there is no current required to change the value of the summing node 314 due to parasitic capacitances at the summing node 314. The N-channel driver 136 has a size that is sufficient to drive the output capacitance 320 of the load at a substantially desired rate. Hence, the slew rate at the output of the N-channel driver 136 is substantially independent of the output load capacitance 320.

Figure 4:
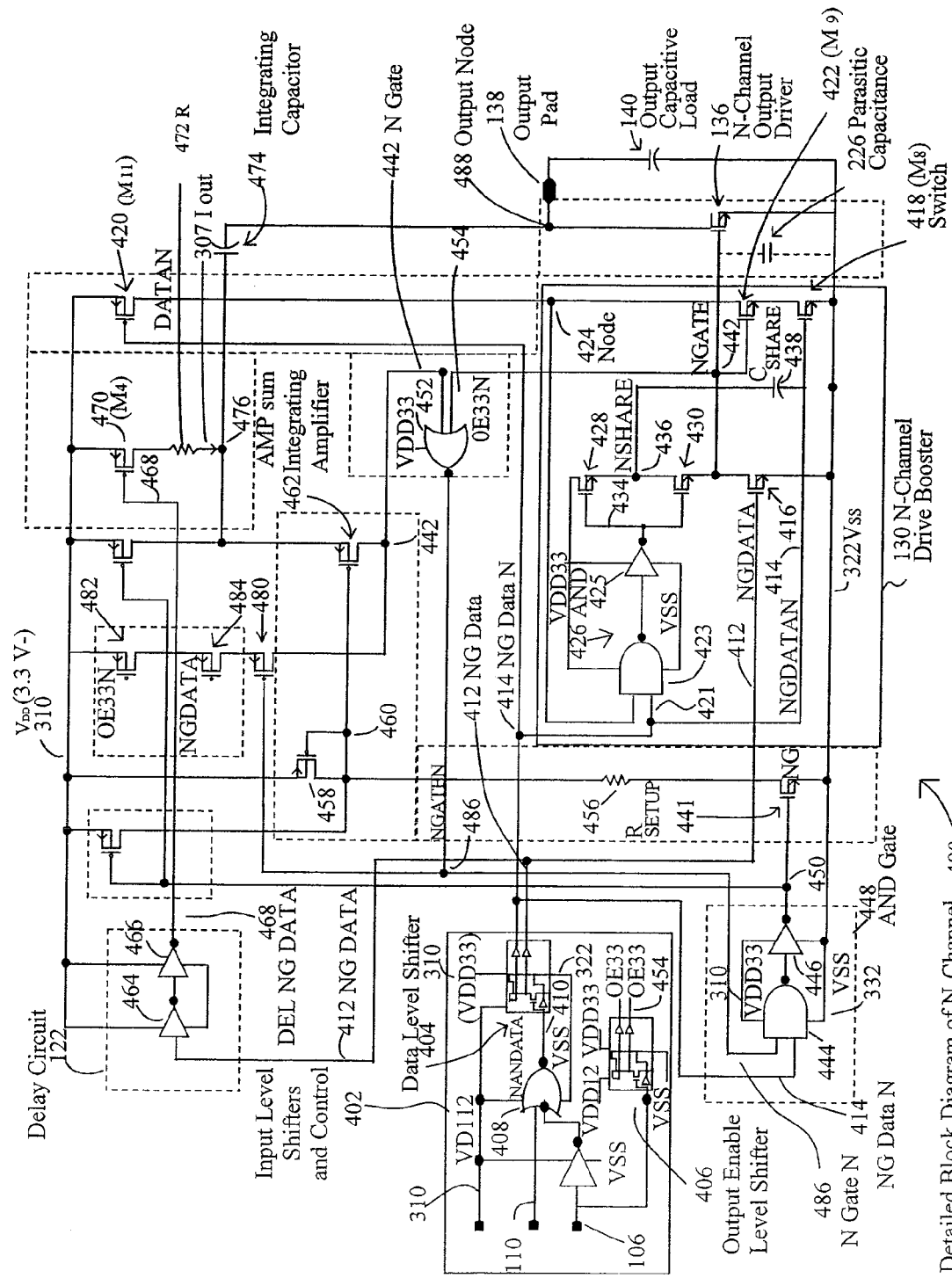
FIG. 4 is a detailed block diagram of an embodiment of the N-channel portion of a controlled output slew rate pad driver.

FIG. 4 is a detailed block diagram 400 of one embodiment of the N-channel portion of a controlled output slew rate pad driver. As shown in FIG. 4, input level shifters and control block 402 include a data level shifter 404 that dynamically shift the voltage level of the data signals. Similarly, the output enable level shifter 406 dynamically shifts the voltage level of the output enable signal. Again, the purpose of the level shifters 404, 406 is to translate a lower, integrated circuit core signal to a higher voltage, input/output domain signal. The data level shifter 404 provides balance delays between the input signal and the complimentary, level-shifted output signal. The data level shifter 404 and output enable level shifter 406 are designed so that no static power is used. Various control signals are not shown in FIG. 4. Other level shifters can be adapted to provide the same basic function as the data level shifter 404 and the output enable level shifter 406.

The operation of the circuit of FIG. 4 is described in detail below. As set forth above, the P-channel side of the output driver, illustrated in FIG. 4, has complimentary circuits. However, some sharing of circuits occurs with the combination of the N-drive side and the P-drive side. For example, the integrating capacitor 474 can be shared utilizing a multiplexer between the N-side integrating amplifier 462 and the P-side integrating amplifier (not shown). Sharing, in this fashion, can be accomplished at low data rates. Otherwise, separate integrating capacitors may be used for the N-channel side and P-channel side.

The initial requirement for the operation of the output circuit illustrated in FIG. 7 is that the output enable signal 106 is active high. The output enable signal 106 is illustrated in FIG. 5. The output enable signal 106 enables the circuit of FIG. 4 to operate as an output driver. For purposes of explanation, the output voltage at the output node 488, which is the voltage on output pad 138, is initially assumed to be in a high state, and will be pulled down by the N-channel output driver 136.

The process of transitioning the output voltage at the output pad 138 from a high state to a low state begins with a de-assertion of the data input signal 110. In other words, the data signal 110 goes from a high state to a low state. The data signal 110 is illustrated in FIG. 6. The data signal 110 is received from core circuitry of another integrated circuit or portion of the same integrated circuit (not shown), such as a microprocessor or other device. The data signal 110 is normally received at the core voltage level of the core circuitry. If the core voltage levels from the core circuitry are the same voltage levels that are used in the circuitry of FIG. 4, the level shifting circuits 404, 406 are not necessary. However, in modern, state-of-the-art CMOS technologies, the core voltage levels are normally lower in value than the power supply voltage at which I/O circuitry, such as the circuitry illustrated in FIG. 4, is required to operate. Hence, level shifters, such as data level shifter 404 and output enable level shifter 406, as well as other level shifters, are required to translate the lower value input signals, at the core voltage level of the core circuitry, to the higher voltage levels of the I/O circuit illustrated in FIG. 4.

As shown in FIG. 4, the data signal 110 is gated with the inverse of the output enable signal 106 in NOR gate 408. The output 410 (NANDATA) of NOR gate 408 allows the data signal to pass when the output enable signal 106 is high, and blocks the data signal 110 when the output enable signal 106 is low. The data signal 410 (NANDATA) is transmitted to the data level shifter 404. The data level shifter 404 generates two complimentary signals NGDATA 412 and NGDATAN 414. Both of these signals are slightly delayed from the data signal, as illustrated in FIGS. 6, 7 and 8.

As illustrated in FIGS. 6 and 8, data signal 110 is in phase with NGDATAN signal 414 in FIG. 8, while NGDATA signal 412, shown in FIG. 7, is complimentary. The NGDATA signal 412 and the NGDATAN signal 414 are level shifted signals that are used as initiators in the sequences that occur throughout the circuit illustrated in FIG. 4.

As also shown in FIG. 4, the falling edge of the NGDATA signal 412 drives the gate of transistor 416 low. Simultaneously, the rising edge of NGDATAN signal 414 turns on transistor switch 418, turns off transistor switch 420, and sets a high state at input 421 of NAND gate 422. The process of turning on transistor switch 418 activates the path between transistor switch 418 and transistor switch 422, such that when the gate (NGATE 442) is driven high, there is a current path from node 424 to $V_{SS}$ 322. Turning off transistor switch 420 disconnects any current path from node 424 (out internal)

to $V_{DD}$ 310. Since there is parasitic capacitance on node 424, node 424 will stay in a high state for the necessary time required because transistor switch 420 had previously been on and node 424 was shorted to $V_{DD}$ 310.

FIG. 4 also illustrates the N-channel drive booster 130 that includes an AND gate 426 that is comprised of a NAND gate 423 and an inverter 425. The output 434 of the AND gate 426 drives the gate of transistor switches 428, 430. Prior to the time that NGDATAN 432 goes high, the output 434 of AND gate 426 is low, and transistor switch 428 is on, while transistor switch 430 is off, which shorts node 436 (NSHARE) to $V_{DD}$ 310. As a result, the voltage at node 436, prior to the time that NGDATAN 414 transitions to a high state, is at $V_{DD}$ 310, which causes capacitor 438 to charge to the supply voltage $V_{DD}$ 310. When NGDATAN 414 transitions from low to high, the output 434 of the AND gate 426 transitions from low to high. This causes transistor switch 428 to be turned off and transistor switch 430 to be turned on. In addition, transistor switch 416 is turned off by NGDATA 412, which is transitioning from high to low. Some of the charge that is stored on capacitor 438 (CSHARE) is transferred to the parasitic capacitance 226 that exists between the gate of the N-channel output driver 136 and $V_{SS}$ 322. The charging of the parasitic capacitance 226 will cause the voltage at NGATE node 442 (NGATE) to rise. By setting the value of capacitor 438 at the proper level, the voltage level at NGATE node 442 will rise to a value selected by the designer of the system. For example, the voltage at NGATE node 442 may rise to the threshold voltage ($V_{TH}$) of the N-channel output driver 136, or to a voltage that is greater than the threshold value of the gate to source voltage of N-channel output driver 136, which will cause N-channel output driver 136 to slightly conduct. The charge from the capacitor 438 is switched to the gate of N-channel output driver 136 when transistor switch 430 is turned on. The charge sharing equations are set forth above that allow the parasitic capacitance 226 to be charged to a point so that the current in the N-channel output driver 136 is relatively small in this initial phase. FIG. 11 illustrates the initial rise of the NGATE signal 1100 at node NGATE node 442.

FIG. 4 also illustrates the integration circuit. The NGDATAN signal 414 is used to initiate the establishment of a reference (bias) voltage for the integrating amplifier 462. This is accomplished by turning on transistor switch 441 by transitioning the output 450 of AND gate 448 to a high state. AND gate 448 is formed from an NAND gate 444 and an inverter 446. When the input 486 (NGATEN) and input 414 (NGDATAN) are both high, NAND gate 444 generates a low output, which is inverted by inverter 446 to a high state output 450, that turns on switch 441. The input signal NGATEN 486 is generated at the output of NOR gate 454. NOR gate 452 generates a high voltage at node 486 (NGATEN) since the output enable signal 454 (OE33N) is low (OE33N is the complimentary signal of the level shifted output enable signal OE33) and NGATE node 442 is initially low. When transistor switch 441 turns on, current flows through resistor 456 (RSETUP) and into the diode connected transistor 458. A voltage (AMPREF) is created at node 460 that is less than $V_{DD}$ 310 by an amount of the absolute value of the gate to source voltage of transistor 458. Hence, the voltage (AMPREF) at node 460 is a set reference voltage that is equal to $V_{DD}$ 310 minus the drain to gate voltage of transistor 458. That set reference voltage is then fed to the gate of the integrating amplifier 462 to bias integrating amplifier 462 to the reference voltage.

The next event in the process of the embodiment illustrated in FIG. 4 is the transition of the delayed NGDATA signal (DELNGDATA) 468 that is illustrated in FIG. 9. The delayed NGDATA signal (DELNGDATA) 468 is a delayed version of the NGDATA signal 412 illustrated in FIG. 7. The DELNGDATA signal 468 transitions from high to low in the same manner as the NGDATA signal 412, but delayed in time. The delayed NGDATA signal (DELNGDATA) 468 is delayed in delay circuit 122 by sending the NGDATA signal 412 through inverter 464 and inverter 466. As shown in FIG. 9, the transition of the delayed NGDATA signal (DELNGDATA) 468 initiates the slew 1302 of the output signal 1300 at the output pad 138, as illustrated in FIG. 13. As illustrated in FIG. 4, the delayed NGDATA signal 468 initiates the slewing process by turning on transistor switch 470 and driving the gate of transistor switch 470 low. By providing the proper ratio between transistor 458 and the integrating amplifier transistor 462, a fixed voltage will exist between the drain of transistor 470 and the source of the integrating amplifier transistor 462. This fixed voltage is divided by the current setting resistor 472 (RSLEW) to establish the integration current 307 illustrated in FIG. 3. As set forth above, the integration current can be generated in various ways. This particular implementation ensures that there is no static current flow during the time when the output is not slewing, which is a desirable feature for output drivers.

As shown in FIG. 4, the voltage on integrating capacitor 474 is the voltage that drives output node 488 and the output pad 138. The output voltage on output node 488 starts to slew because the voltage at node 476 (AMPSUM) is held relatively constant and the majority of the integrating current 307 that is generated by resistor 472 (RSLEW) is forced to flow into the integrating capacitor 474. Since the voltage at node 476 (AMPSUM) is constant and there is current flowing, the voltage across the integrating capacitor 474 must change, as determined by the equation dv/dt=I/C, as indicated above. In order to pull down the output node 488, the gate of the N-channel output driver 136 must be driven to a voltage that is consistent with the current needed for the output node 488 to move at a rate dictated by the integrating capacitor 474 and the integration current 307. This means that the N-channel output driver 136 must supply the integrating current, along with any output current needed to discharge the output capacitance of the load 140. In other words, $I_{LOAD}=C_{LOAD}*$ (dv/dt). This requires a slight amount of the integrating current 307 to flow through the integrating amplifier 462 and charge the NGATE node 442 of the N-channel output driver 136. By appropriately sizing the transistors and integrating capacitor 474, the relative current needed to charge the NGATE node 442 of the N-channel output driver 136 is small and does not significantly detract from the governing equations disclosed above.

As shown in FIG. 11, the NGATE signal 1100 at NGATE node 442 rises slightly as the output 1300 at output node 448, illustrated in FIG. 13, gradually decreases at a specific slew rate, as indicated by slew 1302. The slew 1302 is set by the integrating current 307 and the integrating capacitor 474. The slew 1302 continues until the output 1300 reaches its final value which is at or near the voltage level of $V_{SS}$ 322. When the voltage at the output node 488 can no longer change because it has reached the voltage level of $V_{SS}$ 322, the integrating current 307 can no longer flow through the integrating capacitor 474. The integration current 307 must then flow through the integrating amplifier 462 to the NGATE node 442 of the N-channel output driver 136. The NGATE node 442 then starts to rapidly charge to $V_{DD}$ 310 and passes the threshold voltage of NOR gate 452. This changes the state of NOR gate 452 from high to low. This transition is used to switch off the integrating amplifier 462, turn off the integration current 307 and clamp the NGATE node 442 to $V_{DD}$ 310. This is accomplished by pulling the gate of transition switch 480 low, which turns on transistor switch 480. Since transistor switch 482 and transistor switch 484 are already on, based upon the input levels at the gates of these transistors, current flows through transistor switch 482, transistor switch 484 and transistor switch 480 to connect the NGATE node 442 to $V_{DD}$ 310. This also provides positive feedback to NOR gate 452, to ensure that NOR gate 452 is switched to a low state. To avoid static current flow, the output 486 of NOR gate 452 is also fed back to the AND gate 448 to ensure that transistor 441 is turned off. Transistor switch 441 is turned off due to a low value on the gate 450 of transistor switch 441. This causes the node 460 (AMPREF) to be pulled to $V_{DD}$ 310 by transistor 4XX All of the nodes are now in a state that ensures that the output node 488 is driven solidly to ground for the rest of the period when the data signal 110 is low, as illustrated in FIG. 6.

When the data signal 110 goes high, the complimentary circuit (not shown) takes over and operates similarly to the N-channel pull down circuit illustrated in FIG. 4, except that the voltage and currents are the inverse of that shown in FIG. 4. When this occurs, the NGDATA signal 412 goes high, which turns off transistor switch 484 and turns on transistor switch 416. This rapidly turns off the N-channel output driver 136, so as to not interfere with the pull up action of a complimentary circuit. The complimentary circuit has similar functionality, such that throughout the cycle explained above, there is no contention between the N-channel output driver 136 and the P-channel output driver 134. In this manner, shoot through current is eliminated.

Hence, the gate boosting circuit rapidly charges the NGATE node 442 and the parasitic capacitance 226 of the N-channel output driver 136. The charging of the NGATE node 442 is done rapidly without pulling current from the power supply, which could lead to large current spikes (di/dt) that would cause a considerable amount of noise in the circuit. This is the result of the fact that the charge is drawn from a storage capacitor 438 that is charged slowly over time during the center part of the data signal 110, which results in very small di/dt characteristics.

The boost voltage VDD 310 on storage capacitor 438 that is used to charge the parasitic capacitance 226 can be scaled to provide desired gate drives. For example, if an initial current is desired at the time when the NGATE node 442 of the N-channel output driver 136 is initially charged, the reference voltage at node 436 for the sharing capacitor 438 can be a scaled version of the gate to source voltage of the N-channel output driver 136 that is set by a scaled current of the desired current of the N-channel output driver 136. Using a stack of diode-connected N-channel devices that are scaled versions of the output driver 136 as the reference voltage and forcing a scaled current through these devices, a precise gate voltage, that creates a predetermined output current in the output device 136, can be generated by switching in the gate boost storage capacitor 438. By setting the size of the sharing capacitor 438, the output current is equal to the reference current times the scaling factor.

The integrating amplifier 462, that is disclosed in FIG. 4, is connected as a common gate amplifier rather than as a common source amplifier that is typically used for driving output devices. Common source amplifiers are inverting amplifiers, while the unique common gate amplifier disclosed in FIG. 4 has a non-inverting output. In addition, the common gate amplifier illustrated in FIG. 4 has a relatively constant input summing node 476 and provides high bandwidth. The configuration of the integrating amplifier 462, that is illustrated in FIG. 4, has a wide range of applications. Integrating amplifier 462 provides integration at a high rate, i.e. greater than 100 MHz, and unlike prior art amplifiers, the common gate amplifier has no static power dissipation. Static power dissipation is a serious problem in CMOS circuits, since static power increases the power demands on the circuit and causes heat in the circuit, which must be dissipated. Newer CMOS processes of 65 nm and smaller require static power to set up references in level shifters. Elimination of static power requirements through the use of a common gate amplifier, such as illustrated in FIG. 4, for various applications constitutes a significant advantage over prior art techniques that require static power.

Further, the use of the integration techniques disclosed in FIG. 4 to control the slew rate of the output node 488 significantly decreases variations resulting from process, temperature and voltage variations. As disclosed above, strict control of the slew rate at the output node 488 also controls the changing current over time (di/dt) required by the output drivers. Hence, the di/dt of the power supply leads of the package and the board traces are significantly reduced. Minimization of the di/dt of the circuit helps to reduce the noise generated due to inductance in the package and board traces, which is a serious problem in current CMOS chips.

Figure 15:
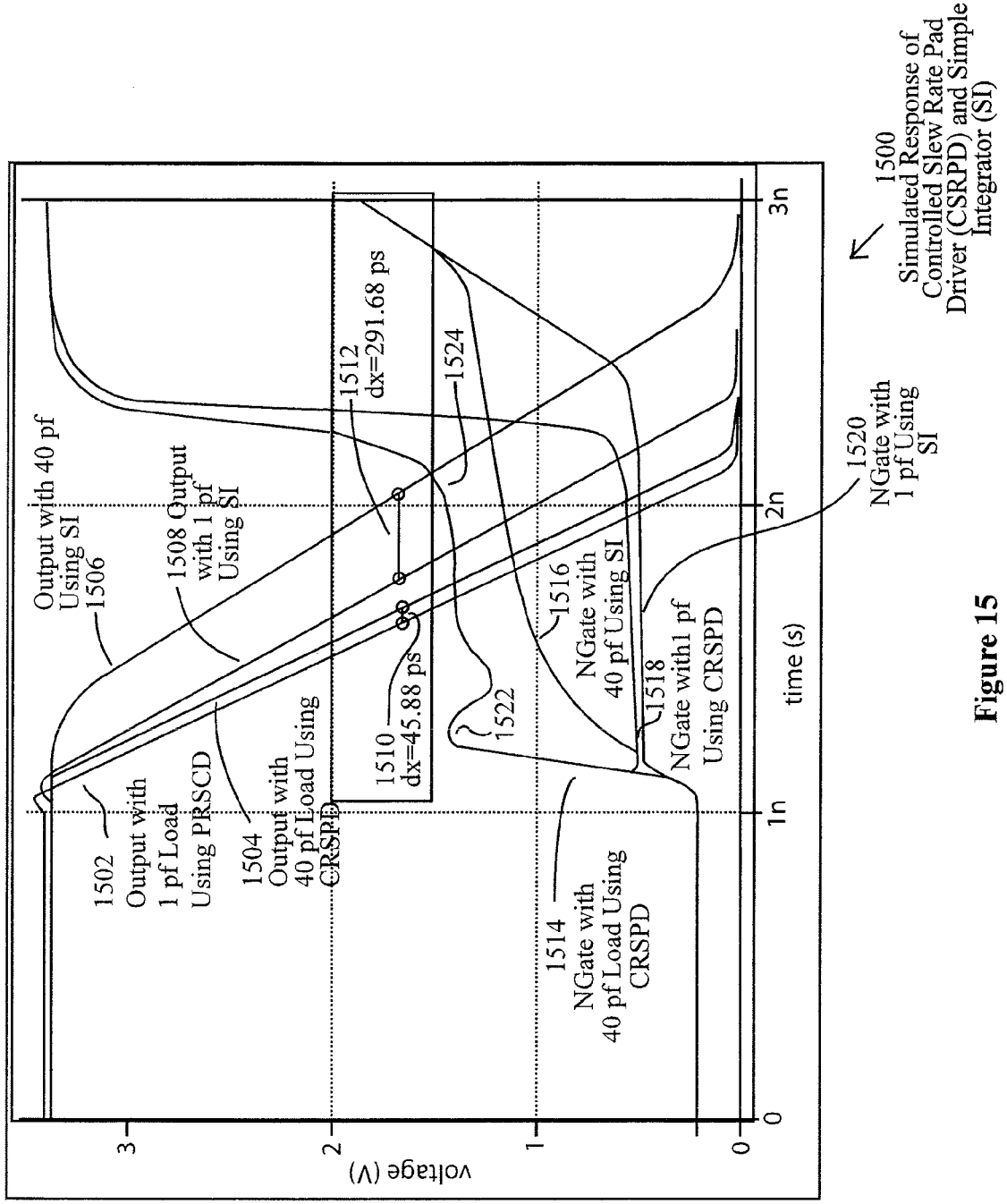
FIG. 15 is a graph of a simulated response of a controlled slew rate pad driver, which is compared to a simple integrator pad driver.

FIG. 15 is a graph 1500 of a simulated response of a controlled slew rate pad driver (CSRPD) and a simple integrator (SI). As illustrated in FIG. 15, response 1502 is the output of the controlled slew rate pad driver with a one picofarad load. Plot 1504 is the output of the controlled slew rate pad driver that is disclosed herein, with a 40 picofarad load. These two plots, with substantially different capacitive loads, show results with minimal variation. For example, the slope of these plots is substantially the same. In addition, the difference of the response shown by these plots is approximately 46 picoseconds in the mid-voltage range. Plot 1508 illustrates the output of the simple integrator, with a one picofarad output load. Plot 1506 shows the output of a simple integrator, with an output capacitance of 40 picofarads. As can be seen from FIG. 15, the slope of these plots is substantially different. The measured delay at mid voltage, between plot 1506 and 1508, is approximately 292 picoseconds, which is approximately six times the delay that was measured for plots 1502 and 1504 using the controlled slew rate pad driver that is disclosed herein.

FIG. 15 also illustrates a plot 1514 of the NGATE response at NGATE node 442, with a 40 picofarad load using the controlled slew rate pad driver disclosed herein. As shown in FIG. 15, the simulated response results in a steep rise time which reaches a peak 1522 in a rapid fashion that precharges the gate voltage of the output driving transistor. Plot 1516 illustrates the simulated response of the gate voltage, with a 40 picofarad output capacitive load using a simple integrator device. As shown in FIG. 15, the response 1516 has a very slow rise time, which substantially delays the initiation of the output signal. Plot 1518 is a graph of the NGATE response of the controlled slew rate pad driver disclosed herein, with a one picofarad load. Plot 1520 is a plot of the simulated response of the gate voltage of a simple integrator using a one picofarad output capacitive load. Although the initiation of the response is not significantly different, there is still a difference shown in the steepness of the rise time of each of these plots. There is a substantial difference, however, between the rise time of plot 1520 and plot 1516, which illustrates the effect of output capacitive loads on prior designs using a simple integrator device.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of generating a controlled voltage on an interface node of an interface circuit to control a process of slewing said controlled voltage on said interface node substantially independently of capacitive loads connected to said interface node comprising:

generating an initial charge on a storage capacitor;

connecting said storage capacitor to a gate of a driver transistor to charge an input parasitic gate capacitance of said driver transistor to approximately a gate threshold voltage of said driver transistor prior to initiating said process of slewing said voltage on said interface node of said interface circuit;

generating a constant current from a constant current source;

applying said constant current to an input of an integrating amplifier and an integrating capacitor that is connected to said interface node;

integrating said constant current during said process of slewing said voltage on said interface node by charging said integrating capacitor with said constant current from said constant current source.

2. The process of claim 1 further comprising:

detecting when said process of slewing said controlled voltage on said interface node is completed by detecting a voltage change on said gate of said driver transistor;

clamping said gate of said driver transistor to a supply voltage when said process of slewing said voltage on said interface node if completed.

3. The process of claim 2 further comprising:

providing a constant voltage;

providing an integrating amplifier that comprises a diode connected transistor;

biasing a gate of said diode connected transistor with said constant voltage.

4. The process of claim 3 wherein said process of providing a constant voltage comprises:

providing said constant voltage from a gate node of another diode connected transistor.

5. A slew control circuit that controls the slew on an interface node comprising:

a driver transistor having a gate and an output that is connected to said interface node to drive said interface node;

a voltage source that provides a supply voltage;

a storage capacitor that is connected to said supply voltage and charges to approximately a gate threshold voltage of said gate of said driver transistor;

a control circuit that disconnects said storage capacitor from said supply voltage and connects said storage capacitor to said gate of said driver transistor to charge said gate of said driver transistor to approximately said gate threshold voltage;

a constant current source that generates a substantially constant current;

an integrating amplifier having an input that is connected to said constant current source and an output that is connected to said gate of said driver transistor;

an integrating capacitor that is connected to said interface node and said constant current source that integrates said constant current and controls said slew on said interface node.

6. The circuit of claim 5 wherein said integrating amplifier comprises a diode connected transistor that has a gate that is biased by a constant voltage source.

7. The circuit of claim 6 wherein said constant voltage source comprises another diode connected transistor that has a gate that is connected to said gate of said diode connected transistor of said integrating amplifier.

* * * * *